(12) United States Patent
Stein et al.

(10) Patent No.: US 9,409,512 B2
(45) Date of Patent: Aug. 9, 2016

(54) BEACON WITH ILLUMINATED LEDS ARRAY BOARDS CONNECTED

(71) Applicant: Code 3, Inc., St. Louis, MO (US)

(72) Inventors: Paul L. Stein, O'Fallon, MO (US); Kyle Christopher Stuesse, St. Peters, MO (US)

(73) Assignee: Code 3, Inc, St. Louis, MO (US)

( * ) Notice: Subject to any disclaimer, the term of this patent is extended or adjusted under 35 U.S.C. 154(b) by 39 days.

(21) Appl. No.: 13/794,360

(22) Filed: Mar. 11, 2013

(65) Prior Publication Data
US 2014/0254189 A1 Sep. 11, 2014

(51) Int. Cl.
| | |
|---|---|
| *B60Q 1/26* | (2006.01) |
| *H05K 1/14* | (2006.01) |
| *F21Y 111/00* | (2016.01) |
| *H05K 3/36* | (2006.01) |

(52) U.S. Cl.
CPC ............... *B60Q 1/2611* (2013.01); *H05K 1/14* (2013.01); *H05K 3/366* (2013.01); *H05K 2201/047* (2013.01); *H05K 2201/10106* (2013.01); *H05K 2201/10121* (2013.01); *H05K 2201/10189* (2013.01); *Y10T 29/49128* (2015.01)

(58) Field of Classification Search
CPC ...... B60Q 1/0052; B60Q 1/0088; B60Q 1/52; B60Q 1/46; B60Q 1/2611
USPC ......................................................... 340/472
See application file for complete search history.

(56) References Cited

U.S. PATENT DOCUMENTS

| | | | | |
|---|---|---|---|---|
| 3,784,809 | A | * | 1/1974 | Smith ................. B60Q 1/2611 340/471 |
| 5,806,965 | A | | 9/1998 | Deese |
| 6,135,612 | A | | 10/2000 | Clore |
| 6,425,678 | B1 | | 7/2002 | Verdes et al. |
| 6,483,439 | B1 | | 11/2002 | Vukosic |
| 6,525,668 | B1 | | 2/2003 | Petrick |
| 6,844,824 | B2 | | 1/2005 | Vukosic |
| 6,948,830 | B1 | | 9/2005 | Petrick |
| 6,991,351 | B1 | | 1/2006 | Petrick |

(Continued)

OTHER PUBLICATIONS

Tyco Electronics' announcement introducing the board to board hermaphroditic blade and receptacle connector for LED lighting modules from 2009.*

*Primary Examiner* — Anh Mai
*Assistant Examiner* — Zachary J Snyder
(74) *Attorney, Agent, or Firm* — Stoel Rives LLP

(57) ABSTRACT

A signal lighting beacon for a vehicle has a base and a plurality of LED arrays mounted on the base. the LED arrays are arranged to direct light signals outward in multiple different radial directions. Each LED array has an LED array circuit board having plurality of LEDs and an electrical connector mounted thereon. A common circuit board is connected to each of the plurality of LED arrays by electrical connectors on the common circuit board. The electrical connectors of single-sided LED circuit boards can be substantially identical to the electrical connectors on a single-sided common circuit board disposed at an angle relative to the LED circuit boards. The connectors can be connected to one another by inserting spade terminals into corresponding sockets from the sides of the sockets. The LED arrays can be pivoted relative to the common circuit board without withdrawing the spade terminals from the sockets.

12 Claims, 14 Drawing Sheets

(56) References Cited

U.S. PATENT DOCUMENTS

| | | | |
|---|---|---|---|
| 7,014,337 B2 | 3/2006 | Chen | |
| 7,079,041 B2 | 7/2006 | Fredericks et al. | |
| 7,387,521 B1 * | 6/2008 | Weber | H01R 13/28 439/224 |
| D592,088 S | 5/2009 | Miller | |
| 7,585,090 B2 | 9/2009 | Wu | |
| D612,760 S | 3/2010 | Chen et al. | |
| 7,712,931 B1 * | 5/2010 | Smith | B60Q 1/2611 362/308 |
| 7,744,251 B2 | 6/2010 | Liu et al. | |
| 7,841,743 B2 | 11/2010 | Wang et al. | |
| 7,959,445 B1 * | 6/2011 | Daily | H01R 12/716 439/65 |
| D669,806 S * | 10/2012 | Stein | D10/114.2 |
| D669,807 S * | 10/2012 | Stein | D10/114.2 |
| D684,078 S * | 6/2013 | Clifford | D10/114.2 |
| D684,492 S * | 6/2013 | Chen | D10/114.1 |
| 8,534,880 B1 * | 9/2013 | Berg et al. | 362/345 |
| 2002/0122309 A1 * | 9/2002 | Abdelhafez | B64F 1/20 362/294 |
| 2003/0020627 A1 | 1/2003 | Vukosic | |
| 2005/0057941 A1 | 3/2005 | Pederson et al. | |
| 2005/0110649 A1 * | 5/2005 | Fredericks et al. | 340/815.45 |
| 2005/0146884 A1 | 7/2005 | Scheithauer | |
| 2006/0028814 A1 * | 2/2006 | Smith | B60Q 1/2607 362/227 |
| 2006/0132323 A1 | 6/2006 | Grady, Jr. | |
| 2006/0176702 A1 | 8/2006 | Shen et al. | |
| 2007/0080645 A1 * | 4/2007 | Smith | B60Q 1/2607 315/83 |
| 2007/0159828 A1 * | 7/2007 | Wang | F21K 9/135 362/294 |
| 2007/0164875 A1 | 7/2007 | Fredericks et al. | |
| 2007/0230184 A1 * | 10/2007 | Shuy | F21K 9/00 362/294 |
| 2008/0106430 A1 | 5/2008 | Yeh | |
| 2009/0040065 A1 | 2/2009 | Dalton et al. | |
| 2009/0045933 A1 | 2/2009 | Smith et al. | |
| 2009/0237927 A1 * | 9/2009 | Zheng | F21S 2/005 362/235 |
| 2010/0109897 A1 | 5/2010 | Hohler | |
| 2010/0244748 A1 * | 9/2010 | Haab | B60Q 1/2611 315/313 |

* cited by examiner

<br>

BEACON WITH ILLUMINATED LEDS ARRAY BOARDS CONNECTED

FIELD OF THE INVENTION

The present invention generally relates to flashing light beacons for use on vehicles.

BACKGROUND OF THE INVENTION

Beacons provide flashing light signals for vehicles such as fire trucks and police cars. Beacons typically have a plurality of lights (e.g., LEDs) mounted inside a lens or other outer cover. The lights are typically connected to a controller that controls operation of the lights. The controller can turn off all the lights for periods when no signal lighting is needed. Further, when signal lighting is desired, the controller can turn the lights on and off (e.g., in a sequence in which some of the lights are on and others may be off during a particular instant) in various patterns to create various signal lighting effects. It can be complicated to connect each of the lights to the controller during assembly of a beacon because the lights are typically positioned so they collectively form an annular configuration and face radially outward in different directions and this complicates the assembly.

SUMMARY OF THE INVENTION

One aspect of the invention is a beacon for a vehicle. The beacon has a base configured for mounting on the vehicle. A plurality of LED arrays are mounted on the base. Each LED array has an LED array circuit board extending upwardly from the base, a plurality of LEDs mounted on the circuit board, and an electrical connector supported by the LED array circuit board and connected to the LEDs. The LED arrays are being arranged to direct light signals outward in multiple different radial directions. The beacon has a common circuit board connected to each of the plurality of LED arrays. The common circuit board includes a plurality of electrical connectors supported by the common circuit board and connected to electrical components on the common circuit board. The electrical connectors on the common circuit board are connected to the electrical connectors of the LED arrays so the LEDs are in electrical connection with the electrical components on the common circuit board. The electrical connectors of the LED circuit boards and the common circuit board are substantially identical to one another.

Another aspect of the invention is a beacon for a vehicle. The beacon has a base configured for mounting on the vehicle. A plurality of LED arrays are mounted on the base. Each LED array has an LED array circuit board extending upwardly from the base, and a plurality of LEDs mounted on the circuit board, and an electrical connector supported by the LED array circuit board and connected to the LEDs. The LED arrays are arranged to direct light signals outward in multiple different radial directions. The beacon has a common circuit board connected to each of the plurality of LED arrays. The common circuit board has a plurality of electrical connectors supported by the common circuit board and connected to electrical components on the common circuit board. The electrical connectors on the common circuit board are connected to the electrical connectors of the LED arrays to form mated connector pairs so the LEDs are in electrical connection with the electrical components on the common circuit board. Each mated connector pair includes a spade terminal on one of the electrical connectors of the mated electrical pair received in a socket of the other electrical connector of the mated electrical pair. The spade terminal extends into the socket from a side of the socket.

Another aspect of the invention is a method of connecting an LED array of a signal lighting beacon to a common circuit board of the signal lighting beacon. The method includes inserting a spade terminal of an electrical connector on one of the LED array and common circuit board into a socket of another electrical connector on the other of the LED array and common circuit board, wherein inserting the spade into the socket comprises inserting the spade terminal into the socket from a side of the socket.

Other objects and features will be in part apparent and in part pointed out hereinafter.

BRIEF DESCRIPTION OF THE DRAWINGS AND APPENDIX

Corresponding reference characters indicate corresponding parts throughout the drawings.

DESCRIPTION OF THE PREFERRED EMBODIMENTS

Figure 12:
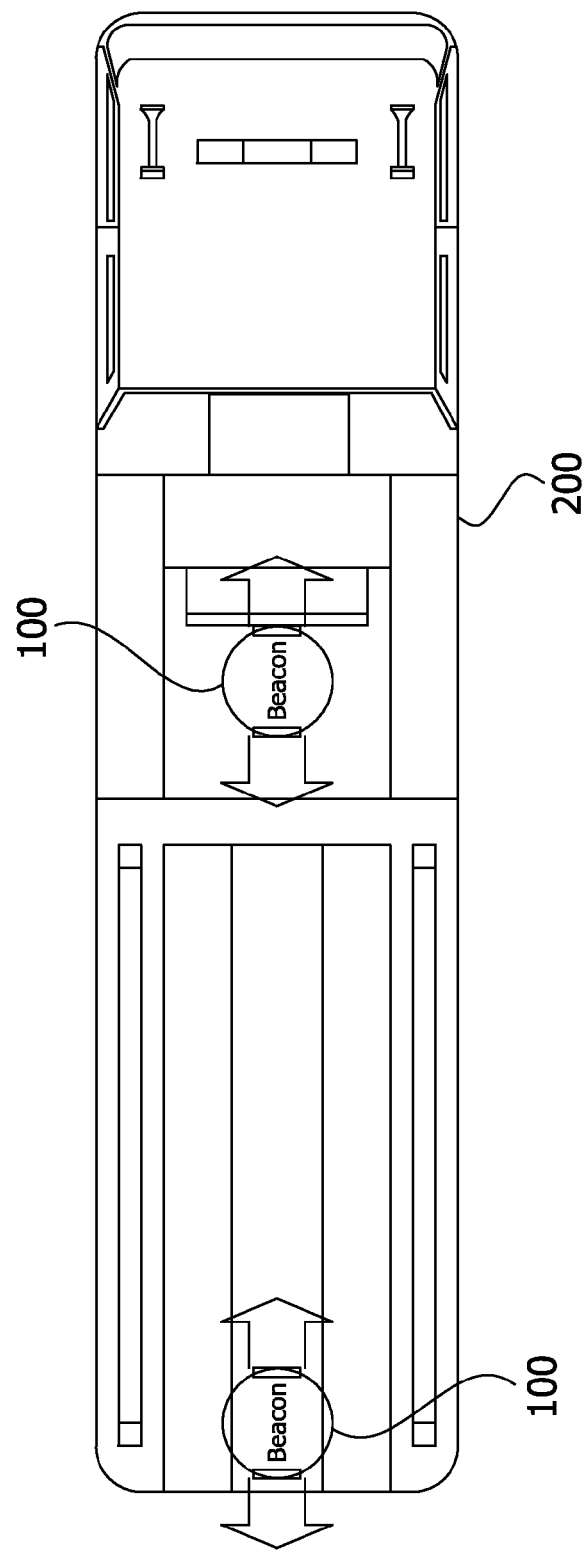
FIG. 12 is a top plan of a vehicle having a pair of beacons mounted thereon.

Referring to the figures, a beacon 100 is illustrated for a vehicle such as the vehicle 200 as shown in FIG. 12. The vehicle of FIG. 12 is illustrated as a fire truck. However, it is contemplated that beacon 100 may be used with any vehicle within the scope of the invention. For example, any vehicle such as an ambulance, a police vehicle, a fire vehicle, an emergency vehicle, or a maintenance vehicle may use the beacon 100. As another example, any vehicle in which a user desires to have scene lighting, either flashing or steady burn, may use the beacon 100. Herein, the vehicle 200 may be referred to as a fire truck but it should be understood that vehicle 200 may be any vehicle.

Figure 2:
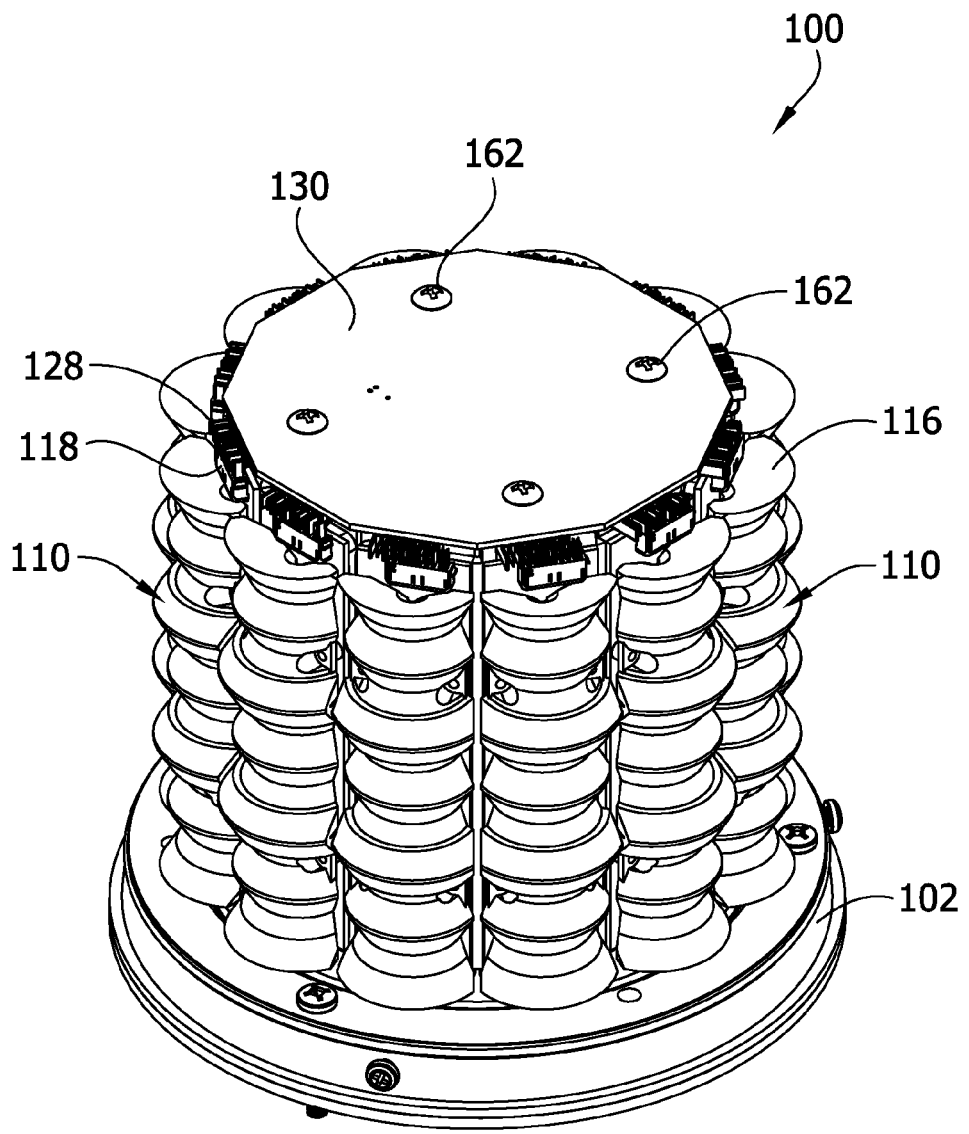
FIG. 2 is another perspective of the beacon of FIG. 1 shown with an outer lens cover removed.
Figure 3:
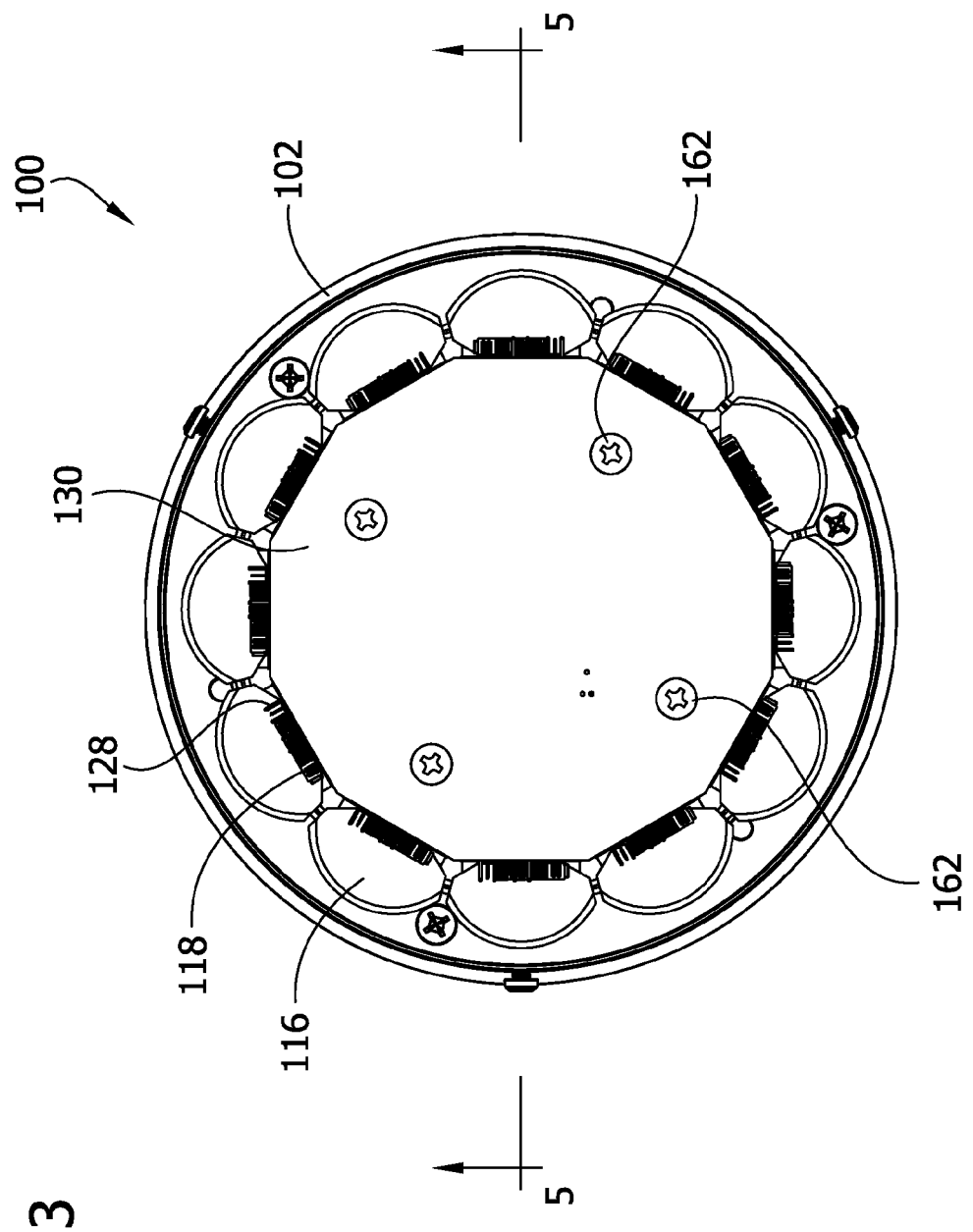
FIG. 3 is a top view of the beacon of FIG. 1 with the outer lens cover removed as in FIG. 2.
Figure 4:
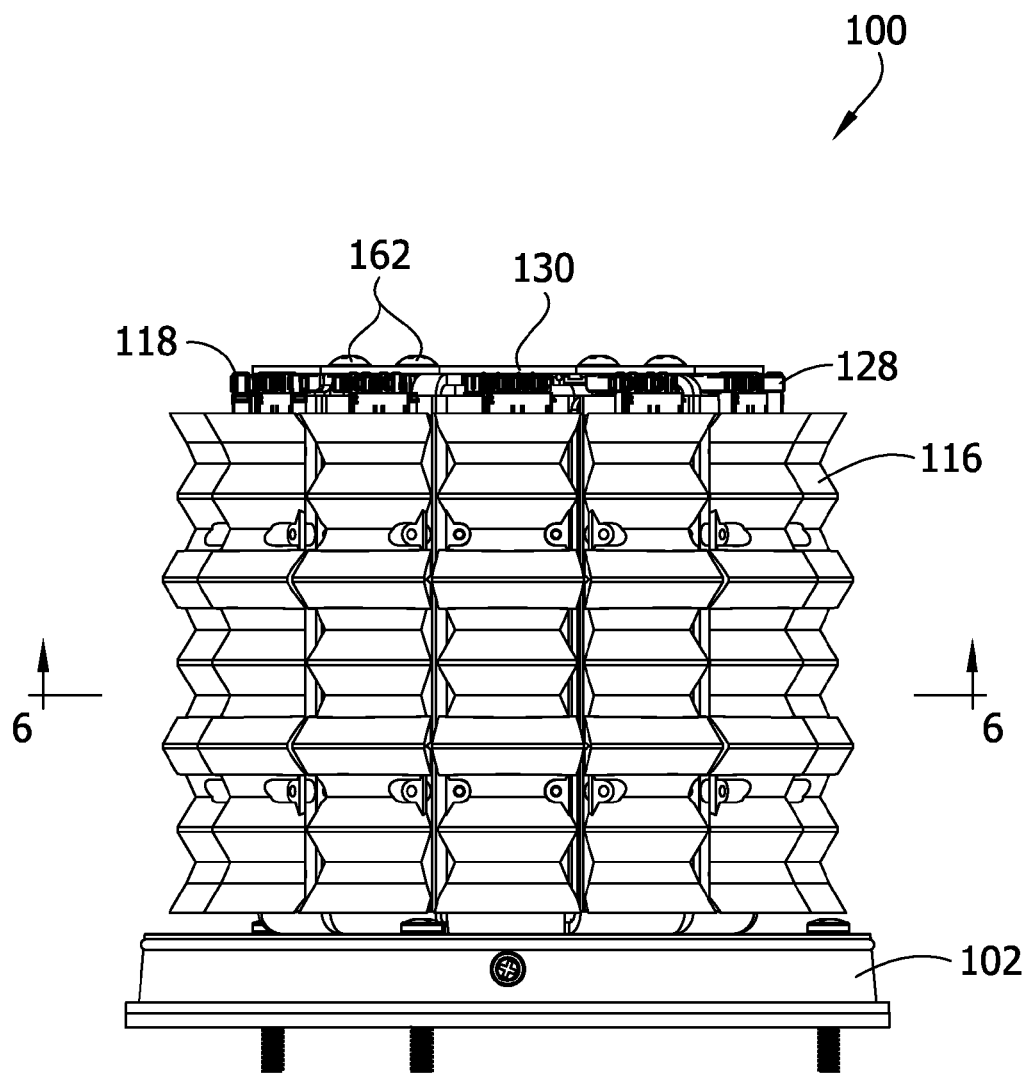
FIG. 4 is a side elevation of the beacon of FIG. 1 with the outer lens cover removed as in FIG. 2.

As illustrated, the beacon 100 suitably has a circular base 102 configured for horizontal mounting on the fire truck 200. For example, the base 102 may have a socket 104 (FIG. 5) for engaging a vertical support post (not shown) of the fire truck 200. Referring to FIG. 2, the beacon 100 includes a plurality of LED arrays 110 mounted on the base 102 for providing light signals. In the illustrated embodiment, there are twelve LED arrays 110, but this number can vary within the scope of the invention. In the illustrated embodiment, the LED arrays 110 are all substantially identical so a detailed description of one will suffice for them all. However, it is understood that one or more of the LED arrays can be different from the other LED arrays within the scope of the invention.

Figure 5:
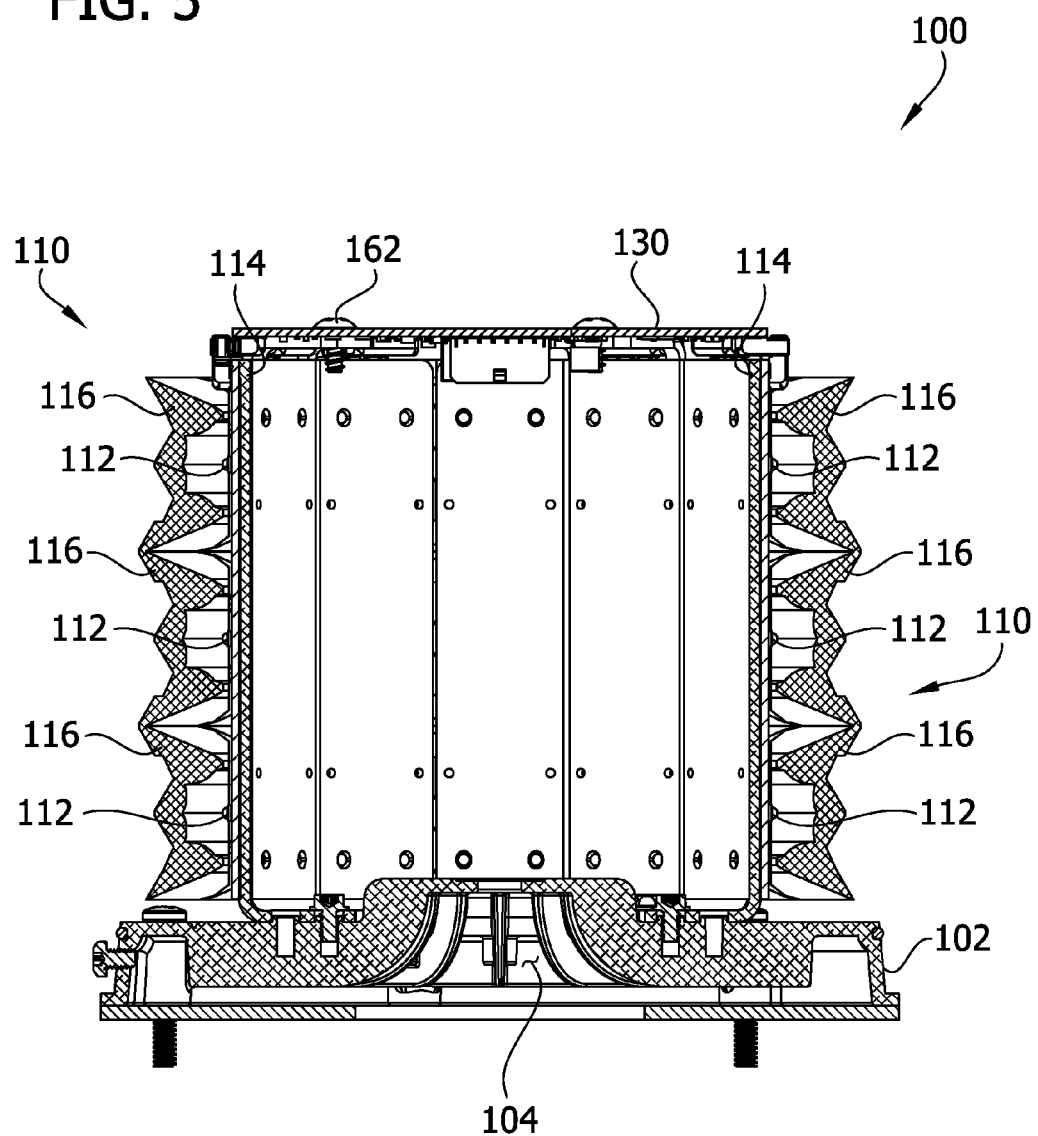
FIG. 5 is a cross section of the beacon of FIG. 1 with the outer lens cover removed taken in a plane including line 5-5 on FIG. 3.
Figure 6:
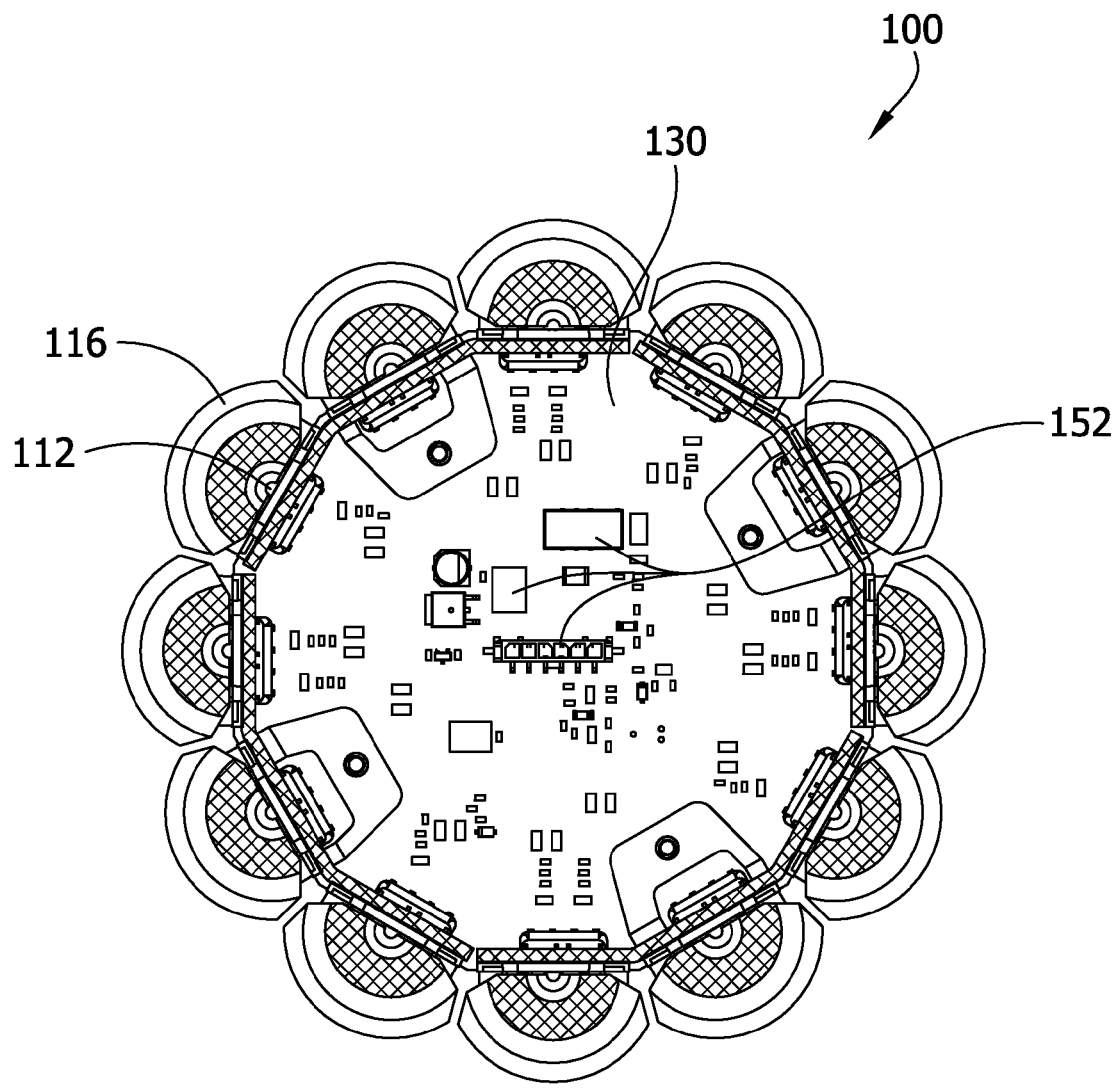
FIG. 6 is a cross section of the beacon of FIG. 1 with the outer lens cover removed taken in a plane including line 6-6 on FIG. 4.
Figure 7:
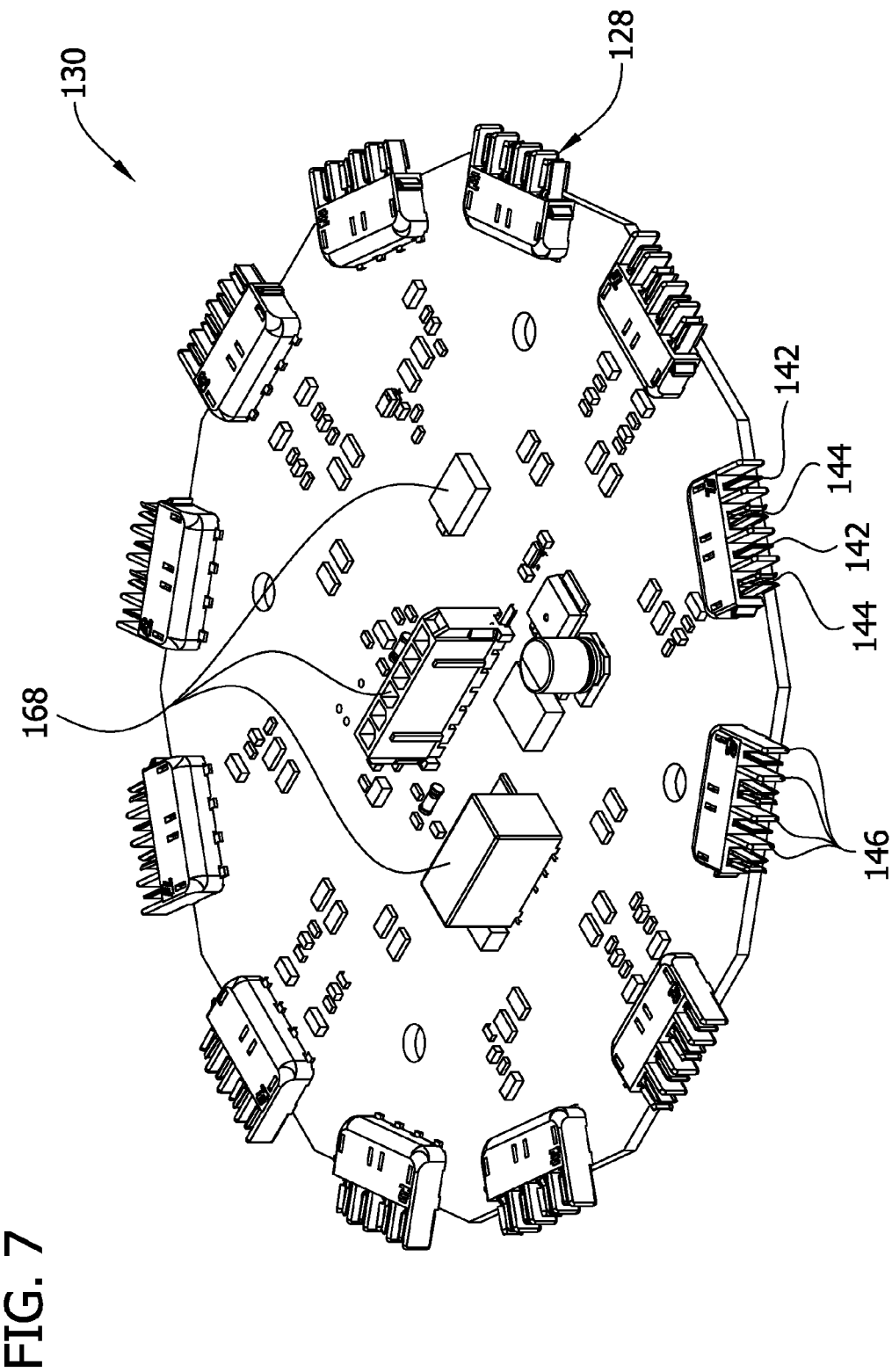
FIG. 7 is a perspective of one embodiment of a circuit board having a plurality of connectors thereon.
Figure 8:
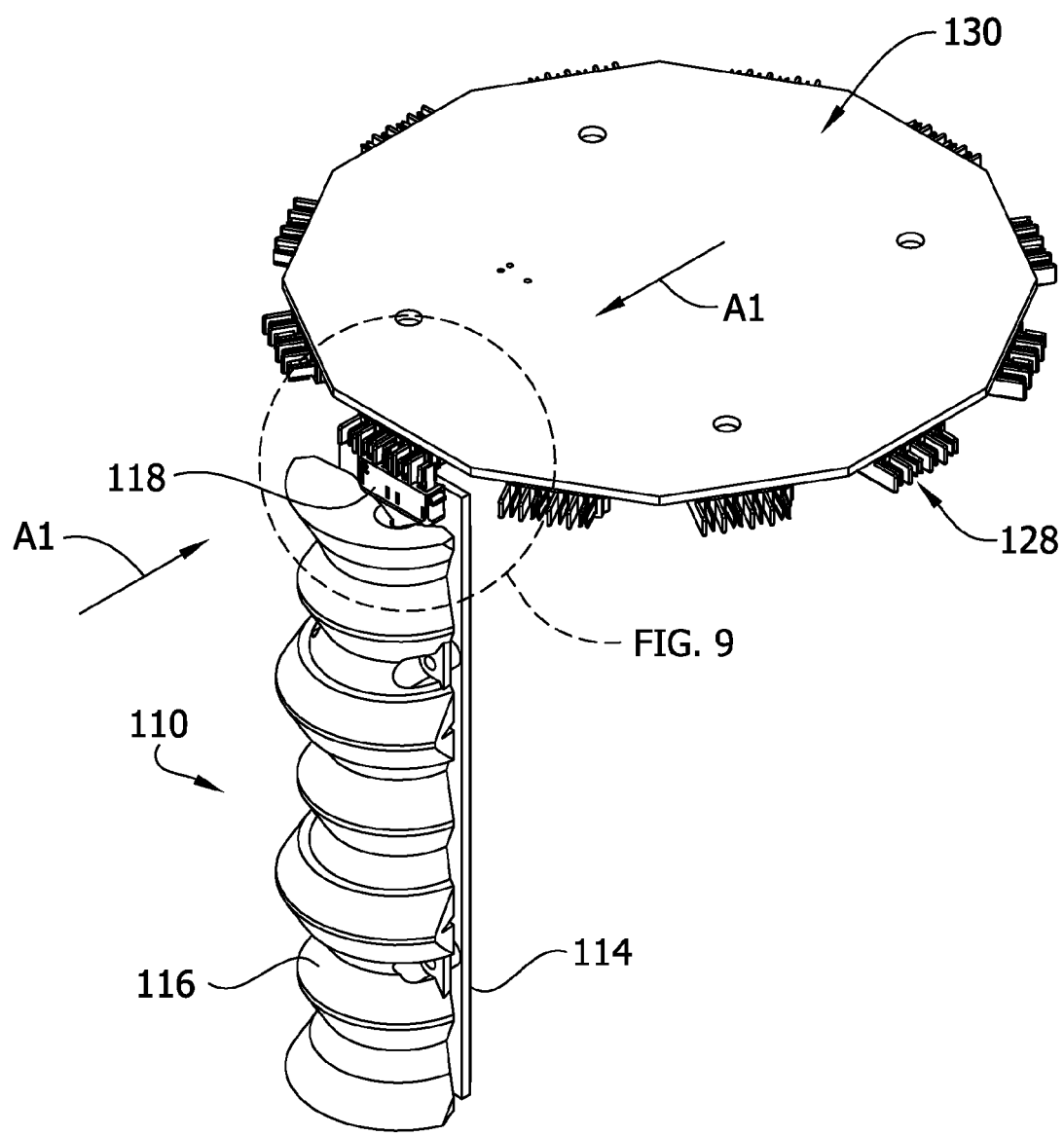
FIG. 8 is a perspective of an LED array of the beacon illustrated in FIG. 1 connected to a common circuit board thereof.

As illustrated in FIGS. 5, 6, and 8 each LED array 110 includes a plurality of LEDs 112 mounted on an LED circuit board 114. In the illustrated embodiment, the LED circuit board 114 has a rectangular shape and is substantially planar. The LEDs 112 are suitably arranged in a linear pattern (e.g., in a substantially vertical line) along the length of the LED circuit board 114, although the number and arrangement of the LEDs can vary within the broad scope of the invention. In the illustrated embodiment, for example, there are three LEDs 112 mounted along the central longitudinal axis of the LED circuit board 114. Each LED 112 is suitably covered by a lens 116 secured to the LED circuit board 114. Accordingly, the LED array 110 has a linear configuration in which the LEDs 112 and the corresponding lenses 116 extend substantially the entire length of the LED circuit board 114. In one example, the lenses 116 are configured to focus the light from the respective LED 112 within a substantially horizontal plane. Those skilled in the art will be familiar with a variety of commercially available lenses that can be used to focus, disperse, or otherwise direct the light from the LEDs in a desired manner.

Figure 11A:
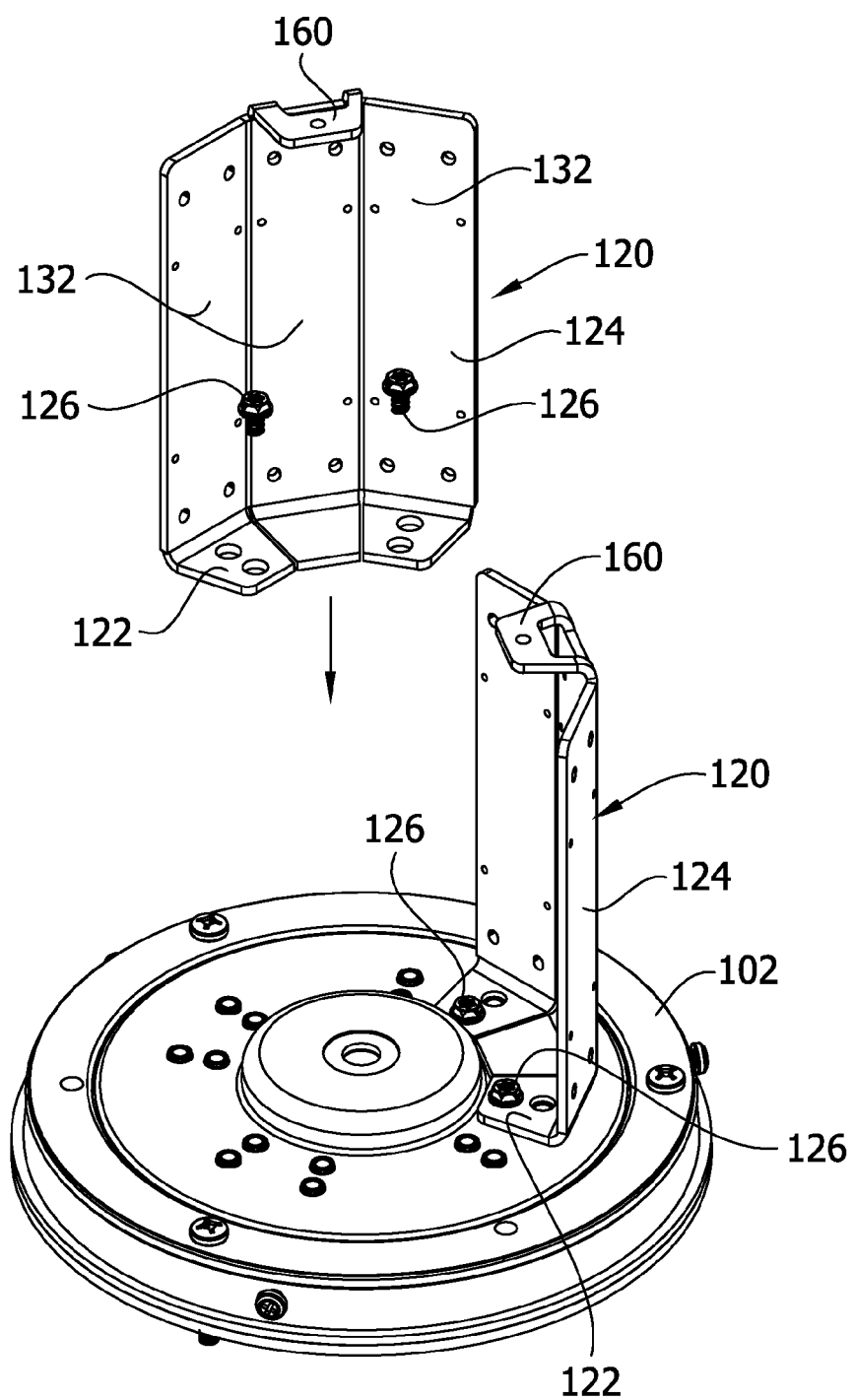
FIGS. 11A-11C illustrate one embodiment of steps in a method of assembling the beacon illustrated in FIG. 1.
Figure 11B:
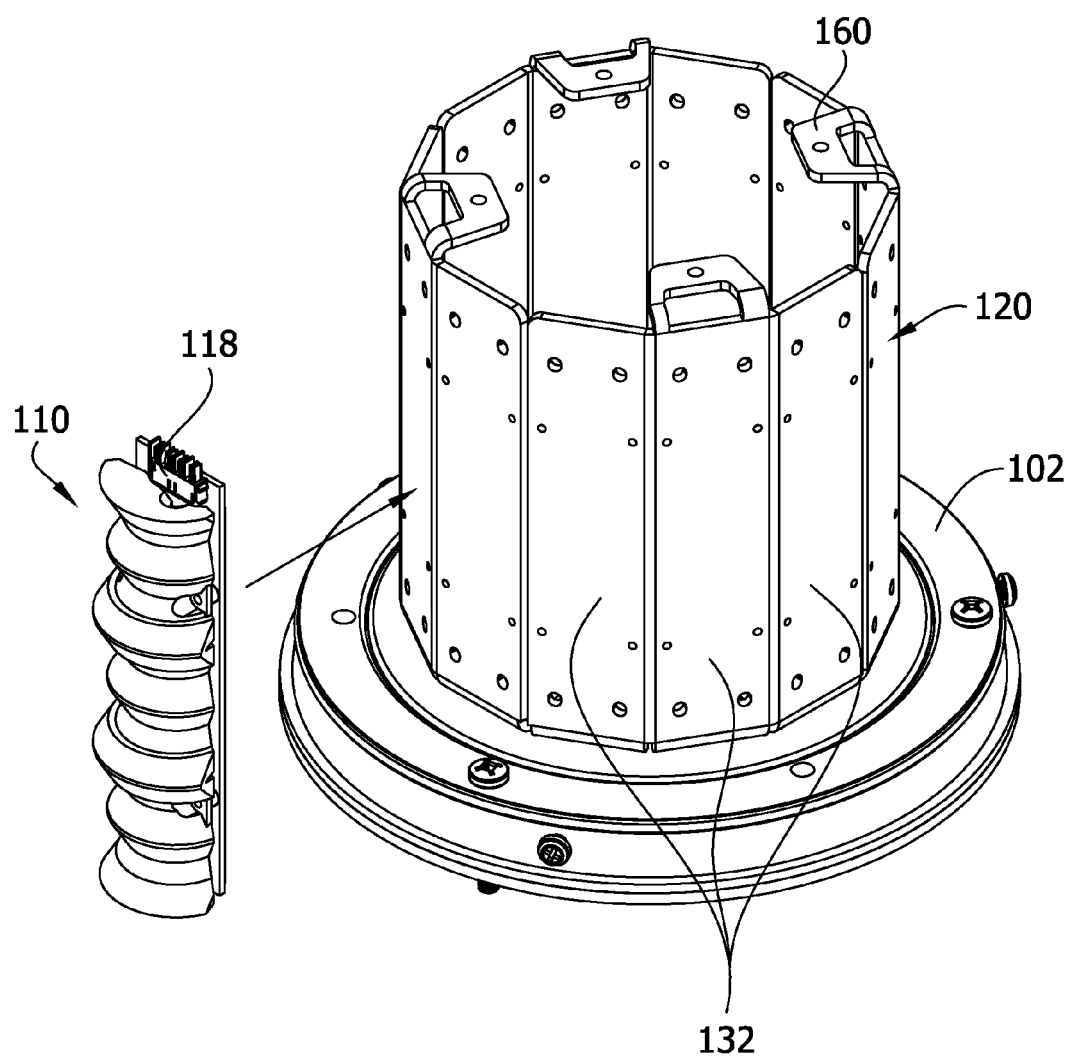
Figure 11C:
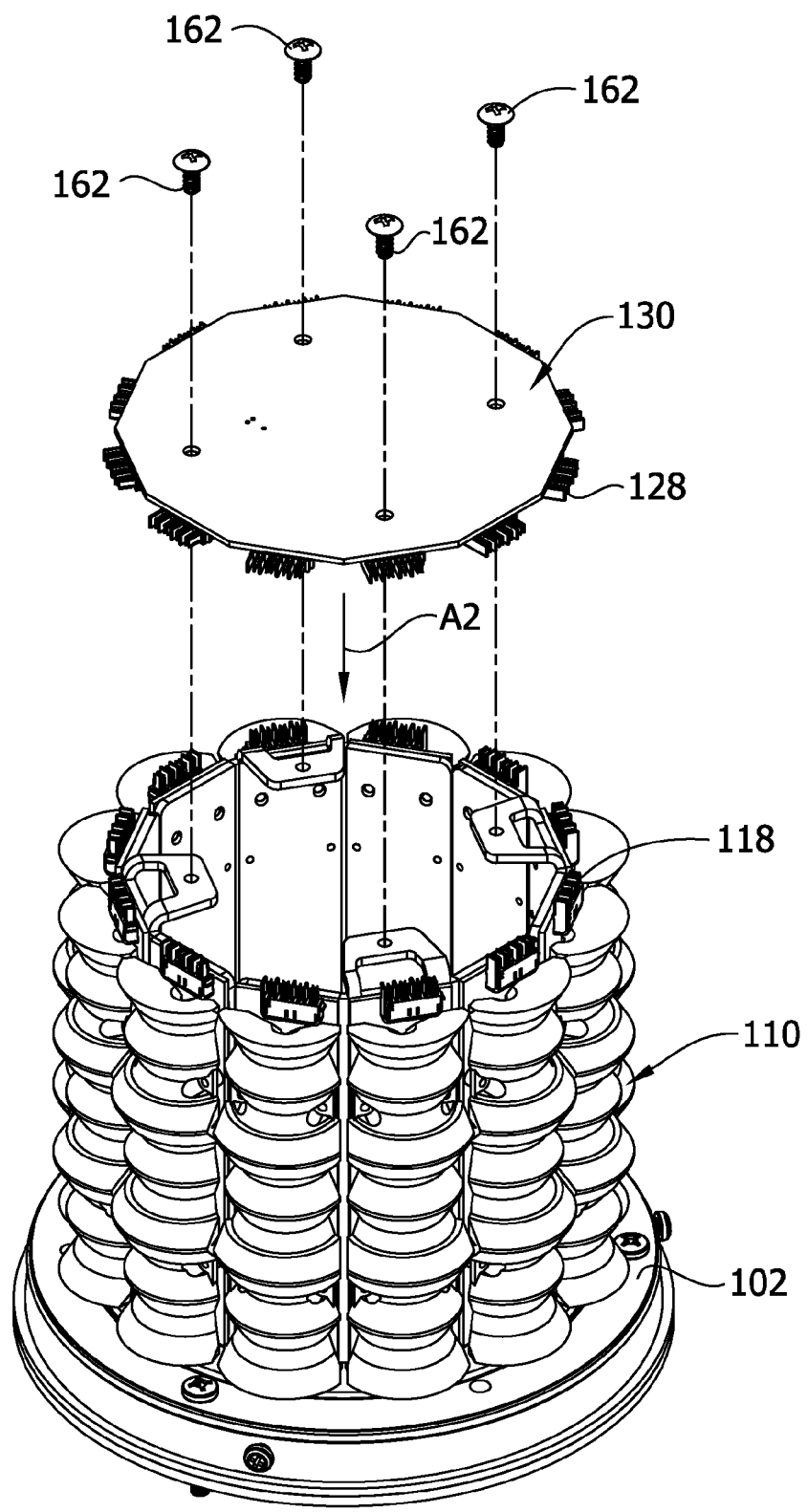

Each LED array 110 is connected to and vertically supported by the base 102. Referring to FIGS. 11A-11C, each LED array 110 is suitably secured to a bracket 120 that is itself secured to the circular base 102. For example, screws 126 or other suitable fasteners can be used to secure the brackets 120 to the base 102 and to secure the LED arrays 110 to the brackets. As illustrated in FIG. 11A, each bracket 120 has a foot 122 adapted to sit on the base 102 and an upright portion 124 adapted to extend upward from the foot and the base. The LED arrays 110 are secured to the upright portion 124 of the bracket 120 so the brackets hold the LED arrays in an upright orientation relative to the circular base 102. In the illustrated embodiment, the upright portion 124 of each bracket 120 has three different faces 132, each of which can support a single LED array 110. Each of the faces 132 is oriented in a different direction so the bracket 120 can support multiple LED arrays 110 in a configuration in which each LED array is pointed in a different radial direction. The use of brackets 120 that can support more than one LED array 110 can expedite assembly because fewer steps are required to secure all the brackets to the base 102. Although the beacon 100 illustrated in FIGS. 11A-11C has four brackets 120 that are each adapted to support three LED arrays 110, it is understood that the number of LED arrays that are supported by a single bracket can vary within the scope of the invention. Further, it is possible that some of the brackets may support a different number of LED arrays from the number of LED arrays supported on other brackets within the scope of the invention.

The LED arrays 110 are suitably arranged in a cylindrical configuration in which each LED array has an upright orientation and the LEDs 112 are positioned to direct light generally radially outward, as shown in FIG. 6. The arrangement of the LED arrays 110 allows for providing substantially 360 degrees of horizontal lighting relative to the fire truck 200 or other vehicle.

The LED circuit boards 114 of the LED arrays 110 are electrically connected to a common central circuit board 130 via connectors 118, 128. Referring to FIGS. 7-10, the common circuit board 130 and the LED circuit boards 114 are single-sided boards, meaning all electrical connections and components are on one side of the board. In the case of the LED circuit boards 114, the electrical components and connections are suitably on the side of the board facing radially outward. In the case of the common central circuit board 130, all electrical components 152 and connections are suitably on the side of the board facing down toward the circular base 102. Although use of single-sided circuit boards 114, 130 constrains all electrical components and connections to be on only one side of the board, they can be substantially cheaper to manufacture than double-sided circuit boards.

Because the single-sided circuit boards 114, 130 require all electrical connections to be on a particular side of the board, electrical connectors 118 for the LED arrays 110 are on the side of the respective boards facing radially outward. Likewise, the electrical connectors 128 on the common central board 130 are on the side of the board facing down toward the circular base 102. In the illustrated embodiment, the electrical connectors 118 on the LED array circuit boards 114 are substantially identical to the electrical connectors 128 on the common central board 130. The electrical connectors could be different within the scope of the invention. However, the use of the same type of connector 118, 128 for each board 114, 130 simplifies the inventory requirements for a manufacturing process that makes the beacon 100.

Figure 9:
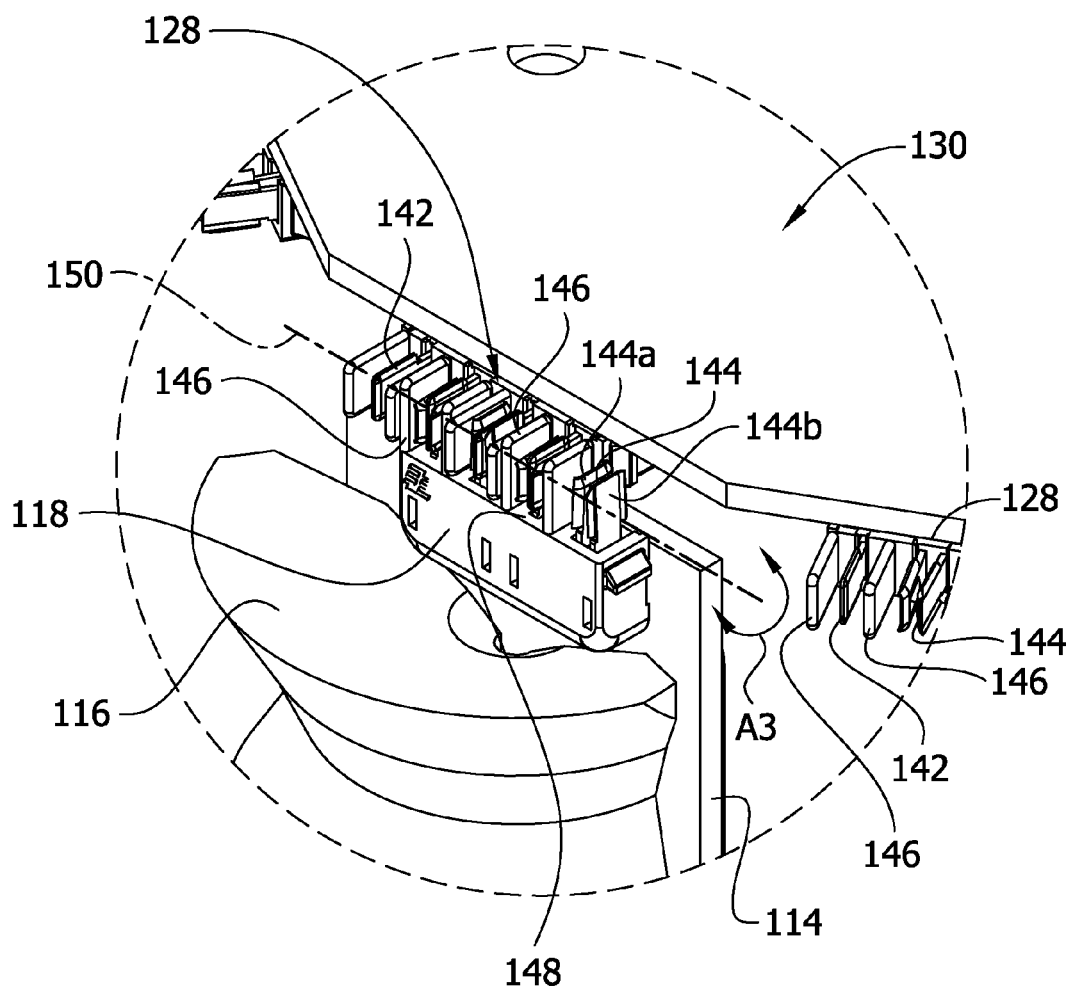
FIG. 9 is an enlarged perspective showing only the area indicated in FIG. 8.
Figure 10:
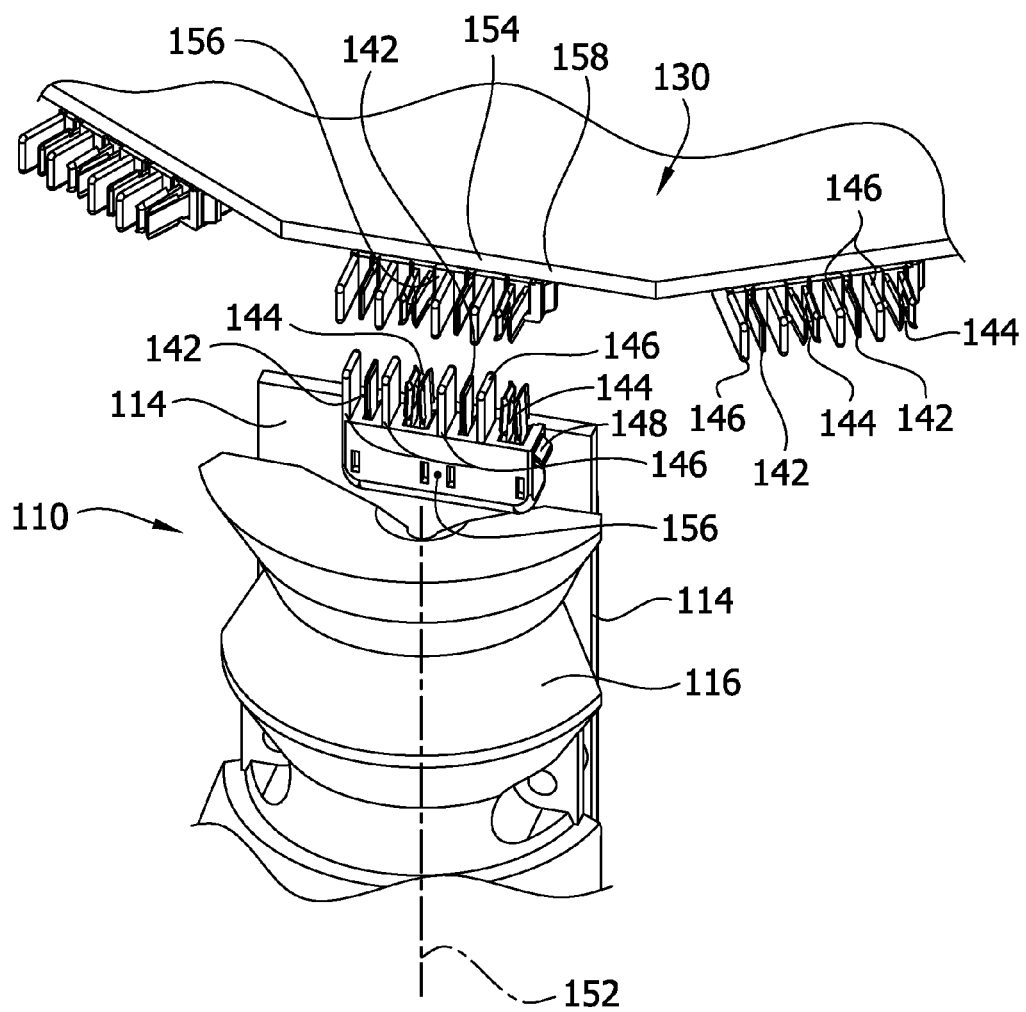
FIG. 10 is an enlarged perspective similar to FIG. 9, but showing the LED array slightly separated from the common circuit board.

Referring to FIGS. 9 and 10, each of the connectors 118, 128 in this embodiment includes a plurality of spade terminals 142 and/or electrical sockets 144 for receiving a corresponding spade terminal on the other connector. For example, a spade terminal 142 is suitably a substantially flat planar piece of electrically conductive material. Generally, a socket 144 is an electrically conductive structure adapted to make an electrical connection with a spade terminal 142 as the spade terminal is inserted into space defined by the socket. For example, the sockets 144 are suitably formed by two generally flat opposing plates 144a, 144b of electrically conductive material spaced apart from one another by a gap for receiving a spade terminal. The edges of the socket plates 144a, 144b are suitably angled away from the opposing plate of the socket 144 to facilitate insertion of a spade terminal 142 into the gap between the plates notwithstanding minor misalignment of the spade terminal that may exist. The spade terminals 142 and the plates 144a, 144b of the sockets 144 suitably extend from a housing 148 of the connectors 118, 128. As used herein, the "base" of a socket 144 refers to the part of the socket adjoining the connector housing 148, the "top" of the socket refers to the end of the socket opposite the connector housing, and the "side" of the socket refers to either of the opposite edge margins of the socket extending between the base of the socket and the top of the socket. As illustrated, each connector 118, 128 includes two spade connectors 142 and two sockets 144 arranged in an alternating series. It is understood that any spade 142 on either connector 118, 128 can be replaced by a socket 144 as long as a corresponding socket on the mating connector is replaced with a spade.

Referring to FIGS. 9 and 10, when the connectors 118, 128 are connected to one another, they are offset relative to one another by one spade/socket position so the spades 142 are aligned with sockets 144 and vice-versa. The use of single-sided boards 114, 130 constrains the way the connectors 118, 128 can be mounted thereon. Consequently, an attempt to connect the identical connectors 118, 128 to one another in a non-offset alignment would result in an attempt to connect the spades 142 to other spades and connect the sockets 144 to other sockets. Accordingly, the mating connectors 118, 128 are laterally offset one position so the spades 142 are aligned with the sockets 144 and vice-versa. Referring to FIG. 10, the centers 156 of the connectors 118 of the LED arrays 110 are suitably offset (e.g., to the right in FIG. 10) from the central longitudinal axis 152 of the LED array 110. Likewise, the centers 156 of the connectors 128 on the common central board 130 are suitably offset (e.g., to the left in FIG. 10) of a midpoint 154 of a side 158 edge of the common board. Although both connectors 118, 128 are offset from a central position on their respective boards 114, 130 in the illustrated embodiment, it is understood the offsetting of the connectors be achieved by offsetting only one connector of each mating pair from its central position on its respective board. It is also understood that the entire LED array 110 can be offset relative to the mating connector 128 on the central board 130 instead of just the connector 118 within the scope of the invention. Moreover, the need to offset the connectors from one another can be avoided (e.g., by using two different types of connectors instead of just a single type of connector) within the scope of the invention.

One consequence of the offset connectors 118, 128 is that the connectors do not make full use of their potential connectivity. For example, the connectors 118, 128 in the illustrated embodiment have the capacity to make four electrical connections, but the way they are connected in the beacon 100 results in only three electrical connections. Three electrical connections are all that is needed in this embodiment, in which each LED array 110 has three LEDs 112. Moreover, connectors that are designed to make two or four connections are readily available from various commercial suppliers, while connectors that are designed to make exactly three electrical connections when fully connected are not as readily available, particularly not at the same relatively low cost as the four-pin connectors 118, 128 used in the illustrated beacon 100.

The connectors 118, 128 are suitably configured so they can be connected to one other by extending the spades 142 of one connector into the sockets 144 of the other connector from the sides of the sockets. The connectors 118, 128 are also suitably configured so the connectors can be rotated relative to one another while they are connected to one another.

In the illustrated embodiment, for example, a plurality of electrical barriers 146 made of an electrically insulating material are positioned between each of the adjacent spades 142 and sockets 144. The barriers 146 are suitably configured so they are effective at maintaining electrical separation between adjacent spades 142 and sockets 144 but so they do not constrain the direction of insertion of spades into the sockets to exclude insertion of the spades into the sockets from the side. In the illustrated embodiment, for example, the barriers 146 are substantially planar walls extending from a connection to the connector housing 148 along a single edge of the barrier. Thus, in addition to allowing for insertion of a spade 142 into a socket 144 in a direction from the open end of the socket toward the connector housing 148, the barriers 146 permit insertion of the spades into the sockets from a side direction (e.g., in a direction generally parallel to the surface of the connector housing adjacent the sockets).

As illustrated in FIG. 8, for example, the connectors 118, 128 can be connected to one another by moving the common central board 130 and LED array 110 laterally toward one another as indicated by arrows A1 while the connectors 118, 128 are oriented generally orthogonally to one another. This results in the spades 142 of the connector 128 on the common board 130 being inserted into the sockets 144 of the connector 118 on the LED array 110 from the sides of the sockets, while the spades on the connector of the LED array are inserted into the sockets of the connector on the common board from the top end of the socket but with the spades being in a sidewise orientation relative to the sockets so that once the connectors are connected all of the spades of both connectors extend into their respective sockets from the side. As illustrated in FIG. 11C, the connectors 118, 128 can also be connected to one another by moving the common board 130 down relative to the LED array 110 while the connectors are oriented substantially orthogonally to one another, as indicated by the arrow A2. This results in the spades 142 of the connectors 118 on the LED arrays 110 being inserted into the sockets 144 of the connectors 128 on the common central board 130 from the sides of the sockets, while the spades on the connectors of the common central board are inserted into the sockets of the connectors on the LED arrays from the top end of the socket but with the spades being in a sidewise orientation relative to the sockets so that once the connectors are connected all of the spades of both connectors extend into their respective sockets from the side.

Moreover, once the spades 142 are received in the sockets 144, the barriers 146 do not obstruct rotation of the spades within the sockets. For example, as illustrated in FIG. 9, the barriers 146 in the illustrated embodiment are configured so the spade terminals 142 can be rotated in either direction on an axis 150 generally perpendicular to the major surfaces of the spades in the direction of arrow A3 while the spades remain in their sockets 144 by rotating the connectors 118, 128 relative to one another after they are connected. This allows the LED array 110, including the LED board 114, to be rotated relative to the common central board 130 after the connectors 118, 128 are connected without disconnecting the connectors and without the need to reconnect the connectors after the rotation.

It is understood the configuration of spades 142, sockets 144, and barriers 146 illustrated in the drawings is one suitable configuration that allows insertion of the spades into the sockets from the side and allows rotation of the connectors 118, 128 while they remain connected to one another and that there are other suitable configurations that could be used instead within the broad scope of the invention.

The common central circuit board 130 is suitably fastened to the brackets 120 to secure it to the LED arrays 110 and maintain electrical connection between the connectors 118, 128, as well as retain it in position relative to the base 102 to which the brackets are secured. For example, the brackets 120 in the illustrated embodiment each have a horizontal mounting tab 160 at their upper end. The common central circuit board 130 is suitably secured to the tabs 160 of the brackets 120 by screws 162 or other suitable fasteners, as illustrated in FIG. 11C.

The common central circuit board 130 has various electrical components 168 mounted to its underside (FIG. 7) for conditioning various input signals to a central processor on the common circuit board and/or for conditioning various output signals from the processor. The components 168 of the common circuit board 130 also suitably include a power supply which is connectable to a power source (not shown) such as a battery of the fire truck 200, through the central socket 104 in the base 102 of the beacon 100. The processor is configured to selectively and intermittently energize the LEDs 112 in the LED arrays 110 and coordinate activities of the LEDs in the LED arrays to achieve various different lighting effects. In one form, the processor may be a flash based, CMOS microcontroller. However any processor or controller may be used.

Figure 1:
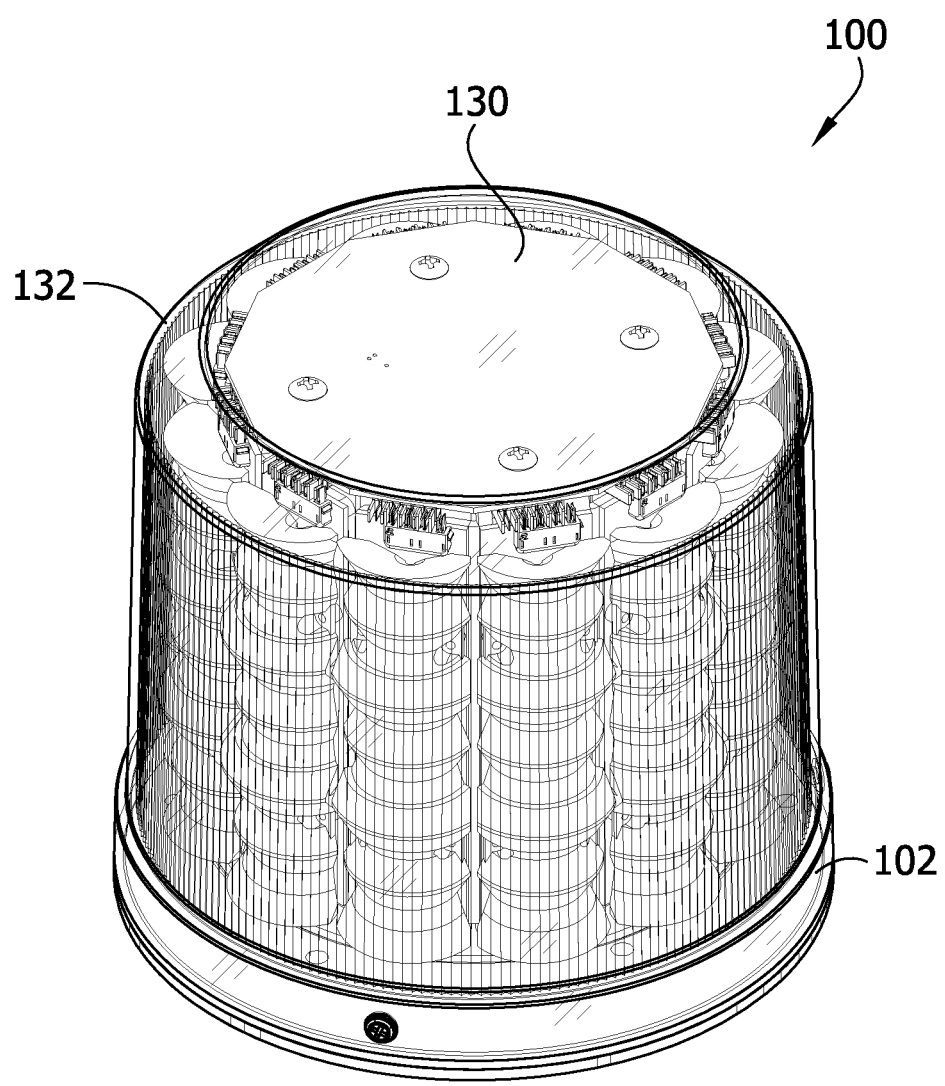
FIG. 1 is a perspective of one embodiment of a beacon of the present invention.

A cylindrical lens cover 132 (FIG. 1) which may be transparent or translucent covers the common central circuit board and the LED arrays 110 and engages the base 102 to create a water-tight unit. The lens cover 132 can include ridges, optic flutes, facets, and/or frosting if desired to make light from the LEDs more diffuse.

FIGS. 11A-11C illustrate one embodiment of a method of manufacturing the beacon 100. The brackets 120 are secured to the base 102, as illustrated in FIG. 11A. In FIG. 11A, the brackets 120 are illustrated as being secured to the base 102 before the LED arrays 110 are secured to the brackets. However, it is noted some or all of the LED arrays 110 can already be secured to the brackets 120 when the brackets are secured to the base if desired. When all of the brackets 120 are secured to the base (FIG. 11B), they form a generally cylindrical support structure that is adapted to hold the LED arrays 110 in a corresponding upright annular configuration. If the LED arrays 110 have not already been secured to the brackets 120, they are suitably secured to the brackets now in preparation for assembly of the common central circuit board 130. Once all of the LED arrays 110 are secured to the brackets 120, the common central board 130 is moved down axially in the vertical direction as indicated by arrow A2 on FIG. 11C to connect the connectors 128 thereon to the corresponding connectors 118 on the LED circuit boards 114 of the LED arrays 110. When the common board 130 is connected to the LED arrays 110 this way all of the connections between the various LED array connectors 118 and the corresponding connectors 128 on the common board 130 can be made substantially simultaneously in a single step. Then the common central circuit board 130 is secured to the brackets 120 using the screws or other suitable fasteners.

Alternatively, one or more of the LED arrays 110 can be added to the assembly after the common central circuit board 130 has been secured to the brackets 120. This can be accomplished by moving the LED array 110 radially inward until the spades 142 and sockets 144 on the connectors 118, 128 engage one another and thereby establish electrical connection between the LED circuit board 114 and the common central circuit board 130. For example, the LED array 110 can be in a vertical orientation (such that the LED circuit board 114 is generally parallel to the mounting portion 124 of the corresponding bracket) as the LED array is moved radially inward to connector the connectors 118, 128. As another example, the LED array 110 is not in a vertical orientation (e.g., it is in a substantially horizontal orientation) as it is moved radially inward to connect the connectors 118, 128 and after the spades 142 are received in the sockets 144, the LED array 110 is pivoted about the pivot axis 150 generally aligned with the spades and sockets to rotate the LED array into the vertical orientation. Then the LED array 110 is secured to the bracket 120 using screws or other suitable fasteners.

In either case, at least one step of the assembly results in arrangement of corresponding connectors 118, 128 on the LED circuit board 114 and the common central circuit board 130 so the connectors are electrically connected to one another in a generally orthogonal orientation (e.g., perpendicular to one another). The ability to connect the connectors 118, 128 to one another so the spades 142 extend into the sockets 144 from the side provides significant flexibility in the manner of making electrical connections, allows all the connectors 118, 128 for all of the LED arrays 110 to be connected simultaneously in a single step if desired, facilitates a simple yet reliable electrical connection between two single-sided circuit boards 114, 130 that are angularly disposed relative to one another, allows easy removal and/or replacement of one or more LED arrays 110 for repair or maintenance of the beacon 100, and provides other advantages.

The abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the invention by way of example and not by way of limitation. This description enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

Having described aspects of the invention in detail, it will be apparent that modifications and variations are possible without departing from the scope of aspects of the invention as defined in the appended claims. It is contemplated that various changes could be made in the above constructions, products, and methods without departing from the scope of aspects of the invention. In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:
1. A beacon for a vehicle comprising:
a base configured for mounting on the vehicle;
a plurality of LED arrays, each of which comprising an LED array circuit board;
a plurality of LEDs mounted on each LED array circuit board;

multiple brackets arranged side by side in a generally cylindrical configuration, each of the multiple brackets having a top portion and a bottom portion, the bottom portions of the multiple brackets mounted to the base, and each of the multiple brackets including multiple exterior faces on which different ones of the LED array circuit boards are mounted, the multiple exterior faces oriented so that the LED arrays direct light signals outward in multiple different radial directions away from the multiple exterior faces;

an electrical connector mounted on each LED array circuit board and connected to the plurality of LEDs mounted on the LED array circuit board; and a common circuit board on which electrical components are mounted, the common circuit board supported by multiple ones of the top portions of the multiple brackets and comprising a plurality of electrical connectors connected to the electrical components on the common circuit board, the electrical connectors on the common circuit board being connected to corresponding ones of the electrical connectors of the plurality of the LED arrays so the LEDs are in electrical connection with the electrical components on the common circuit board, the electrical connectors on the common circuit board connected to the corresponding ones of the electrical connectors of the plurality of the LED arrays forming mated connector pairs, each mated connector pair comprising a spade terminal on one of the electrical connectors of the mated connector pair received in a socket of the other electrical connector of the mated connector pair, the spade terminal extending into the socket from a side of the socket, and thereby facilitating removal or replacement of any one of the plurality of LED arrays from the one of the multiple brackets to which the LED array is mounted.

2. The beacon as set forth in claim 1 wherein the electrical connectors on the LED array circuit boards have a substantially orthogonal orientation relative to the corresponding electrical connectors on the common circuit board.

3. The beacon as set forth in claim 1 wherein the electrical connectors on the LED array circuit boards and the common circuit board are configured so the LED arrays can be rotated relative to the common circuit board without disconnecting the corresponding ones of the electrical connectors from one another.

4. The beacon as set forth in claim 1 wherein the electrical connectors of the LED arrays are offset relative to the electrical connectors on the common circuit board.

5. The beacon as set forth in claim 4 wherein each LED array has exactly three LEDs and the electrical connectors of the LED arrays are four pin connectors.

6. The beacon as set forth in claim 1 wherein the LED array circuit boards of the LED arrays and the common circuit board comprise single-sided circuit boards.

7. The beacon as set forth in claim 1 wherein the electrical connectors on the LED array circuit boards are substantially identical to the electrical connectors on the common circuit board.

8. A method of connecting multiple LED arrays of a signal lighting beacon to a common circuit board of the signal lighting beacon, the signal lighting beacon having a base, the method comprising:

arranging multiple brackets side by side in a generally cylindrical configuration, each of the multiple brackets having a top portion and a bottom portion, and each of the multiple brackets including multiple exterior faces;

mounting the bottom portions of the multiple brackets to the base;

mounting on the multiple exterior faces different ones of the multiple LED arrays, the multiple exterior faces oriented so that the multiple LED arrays direct light signals outward in multiple different radial directions away from the multiple exterior faces, and each of the multiple LED arrays having an electrical connector;

mounting on the top portions of the multiple brackets the common circuit board on which electrical components are mounted, the common circuit board comprising multiple electronic connectors connected to the electrical components on the common circuit board and associated with different ones of the electrical connectors on the multiple LED arrays; and inserting a spade terminal of an electrical connector on each one of the multiple LED arrays or on the common circuit board into a socket of an associated electrical connector on the other of each one of the LED arrays or on the common circuit board, wherein inserting the spade terminal into the socket comprises inserting the spade terminal into the socket from a side of the socket to facilitate removal or replacement of any one of the multiple LED arrays from the one of the multiple brackets to which the LED array is mounted.

9. The method as set forth in claim 8 further comprising rotating one of the LED multiple arrays relative to the common circuit board after the spade terminal is inserted in the socket without removing the spade terminal from the socket.

10. The method as set forth in claim 8 wherein one of the multiple LED arrays is a replacement LED array, and further comprising connecting the replacement LED array to the common circuit board, after removing from the exterior face one of the multiple LED arrays that is not performing properly.

11. The method as set forth in claim 8 further comprising inserting the spade terminal into the socket while the electrical connectors are offset from one another.

12. The beacon as set forth in claim 1 wherein the electrical components mounted on the common circuit board face downward toward the base.

* * * * *